(12) United States Patent  
Goeke et al.

(10) Patent No.: US 7,948,248 B1  
(45) Date of Patent: May 24, 2011

(54) CABLE LENGTH CORRECTION

(75) Inventors: Wayne C. Goeke, Hudson, OH (US); Gregory Sobolewski, Seven Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 489 days.

(21) Appl. No.: 12/134,531

(22) Filed: Jun. 6, 2008

(51) Int. Cl.
*G01R 27/08* (2006.01)
*G01R 27/02* (2006.01)

(52) U.S. Cl. ............... 324/709; 324/76.77; 324/610

(58) Field of Classification Search ........... 324/709, 324/610, 543, 76.77, 706, 725
See application file for complete search history.

(56) References Cited

U.S. PATENT DOCUMENTS

| | | | | |
|---|---|---|---|---|
| 3,005,201 A * | 10/1961 | Rotman | | 343/772 |
| 5,263,189 A * | 11/1993 | Kultgen et al. | | 455/276.1 |
| 5,532,590 A * | 7/1996 | Yamanaka | | 324/239 |
| 6,693,436 B1 * | 2/2004 | Nelson | | 324/537 |
| 6,982,557 B1 * | 1/2006 | Lo et al. | | 324/539 |
| 7,307,430 B2 * | 12/2007 | Tokuno et al. | | 324/610 |
| 7,616,008 B1 * | 11/2009 | Rayman et al. | | 324/607 |
| 7,772,827 B2 * | 8/2010 | Evers et al. | | 324/76.77 |
| 2006/0181293 A1 * | 8/2006 | Sullivan et al. | | 324/754 |
| 2007/0247363 A1 * | 10/2007 | Piesinger | | 342/368 |
| 2008/0030206 A1 * | 2/2008 | Podhajsky et al. | | 324/663 |
| 2008/0042664 A1 * | 2/2008 | Beene | | 324/707 |
| 2008/0265915 A1 * | 10/2008 | Clark et al. | | 324/699 |

* cited by examiner

*Primary Examiner* — Timothy J Dole
(74) *Attorney, Agent, or Firm* — Pearne & Gordon LLP

(57) ABSTRACT

A transmission line impedance compensation method includes the step of providing a measurement device that is adapted to source a test signal having a frequency to a device under test and to determine a corresponding impedance of the device under test using an auto-balanced bridge technique. A first transmission line, a second transmission line, a third transmission line, and a fourth transmission line are connected to said measurement device. An end of the first transmission line is connected to an end of second transmission line. An end of third transmission line is connected to an end of fourth transmission line. A combined phase delay of the connected first and second transmission lines, and a combined phase delay of the connected third and fourth transmission lines, are measured by the measuring device. The device under test is connected to the first transmission line, the second transmission line, the third transmission line, and the fourth transmission line after measuring the phase delays. The corresponding impedance of the device under test is determined based on both of the phase delays.

11 Claims, 2 Drawing Sheets

CABLE LENGTH CORRECTION

BACKGROUND OF THE INVENTION

1. Field of the Invention

The present invention relates to cable length compensation in a measurement device and, in particular, to cable length compensation in a capacitance versus voltage (CV) analyzer that employs an auto-balanced bridge technique.

2. Description of Related Art

It is known to use an auto-balanced bridge technique in a measurement device to measure an alternating current (AC) impedance of a device under test (DUT). It is further known to manufacture cables for use with the measurement device that have a target phase delay, and to compensate for the phase delay in analyzing the DUT. It would be desirable to provide a measurement device that employs an auto-balanced bridge technique and that can directly measure the phase delay of an unknown attached cable, and compensate for the phase delay when analyzing a DUT.

BRIEF SUMMARY OF THE INVENTION

A transmission line impedance compensation method includes the step of providing a measurement device that is adapted to source a test signal having a frequency to a device under test and to determine a corresponding impedance of the device under test using an auto-balanced bridge technique. A first transmission line, a second transmission line, a third transmission line, and a fourth transmission line are connected to said measurement device. An end of the first transmission line is connected to an end of second transmission line. An end of third transmission line is connected to an end of fourth transmission line. A phase delay of the connected first and second transmission lines, and a phase delay of the connected third and fourth transmission lines, are measured by the measuring device. The device under test is connected to the first transmission line, the second transmission line, the third transmission line, and the fourth transmission line after measuring the phase delays. The corresponding impedance of the device under test is determined based on both of the phase delays.

An impedance meter for determining the impedance of a device under test includes a first source terminal for connecting the impedance meter to the device under test, a first sense terminal for connecting the impedance meter to the device under test, a second source terminal for connecting the impedance meter to the device under test, and a second sense terminal for connecting the impedance meter to the device under test. The impedance meter is adapted to determine an electrical length of a first transmission line connected to at least one of said terminals.

Another transmission line impedance compensation method includes the step of providing a measurement device that is adapted to source a test signal having a frequency to a device under test and to determine a corresponding impedance of the device under test using an auto-balanced bridge technique. The measurement device includes a first terminal, a second terminal, a third terminal, and a fourth terminal. An end of a first transmission line is connected to the first terminal. Another end of the first transmission line is connected to a second terminal. An end of a second transmission line is connected to the third terminal. Another end of the second transmission line is connected to the fourth terminal. The measurement device measures a phase delay of the first transmission line and a phase delay of the second transmission line. An end of a third transmission line is connected to an end of the first transmission line. Another end of the third transmission line is connected to one of the first terminal and the second terminal. An end of a fourth transmission line is connected to an end of the second transmission line. Another end of the fourth transmission line is connected to one of the third terminal and the fourth terminal. The measurement device measures a combined phase delay of the connected first and third transmission lines and a combined phase delay of the connected second and fourth transmission lines. A difference between the combined phase delay of the connected first and third transmission lines and the phase delay of the first transmission line is calculated to determine a phase delay of the third transmission line. A difference between the combined phase delay of the connected second and fourth transmission lines and the phase delay of the second transmission line is calculated to determine a phase delay of the fourth transmission line. The corresponding impedance of the device under test is determined based on the phase delay of the third transmission line and the phase delay of the fourth transmission line.

DETAILED DESCRIPTION OF THE INVENTION

Figure 1:
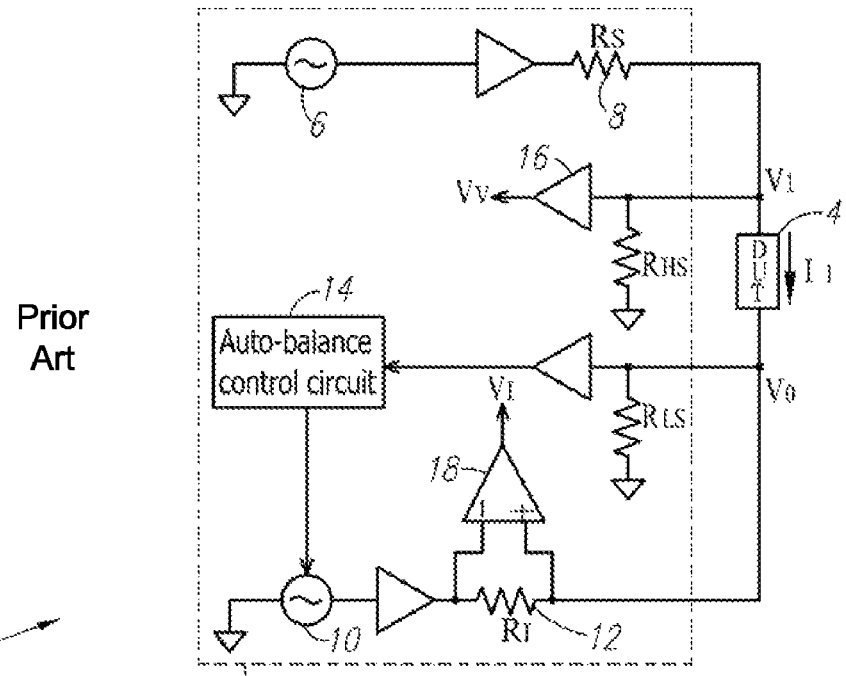
FIG. 1 is a schematic diagram of a circuit for measuring an impedance using an auto-balanced bridge technique.

The present invention relates to transmission line or cable length compensation in a measurement device and, in particular, to cable length compensation in a capacitance versus voltage (CV) analyzer that employs an auto-balanced bridge technique. The present invention will now be described with reference to the drawings, wherein like reference numerals are used to refer to like elements throughout. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

The term "transmission line" refers to a conductive path between two points. Example transmission lines include coaxial cables, parallel two-wire, twisted pairs, strip lines, waveguides, and the like. Also included may be, for example, connectors and other devices included in the conductive path. Transmission line characteristics often become significant when the electrical length of the transmission line exceeds ¼ of the shortest wavelengths of the transmitted signal. If the transmission line characteristics, such as phase delay, become significant, it may be desirable to compensate for the electrical length of the transmission line when making impedance measurements on a DUT.

FIG. 1 provides a schematic diagram of a circuit 1 within a measurement device 2 for measuring the impedance of a DUT 4. The measurement device 2 can be a CV analyzer that generates a test signal 6 having a frequency and determines the capacitance of the DUT 4 using an auto-balanced bridge technique.

The auto-balanced bridge technique will now be described. The test signal 6, for example, a sine wave, is applied to the DUT 4 via a pathway that includes resistor $R_S$ 8. Another signal 10, for example, another sine wave, is applied via a pathway that includes resistor $R_I$ 12. An auto-balance control circuit 14 monitors a voltage $V_0$ within the circuit 1. The auto-balance control circuit 14 adjusts the amplitude and phase of signal 10 to maintain voltage $V_0$ at zero volts.

The measurement device 2 monitors a voltage $V_V$ at the output of a buffer 16. The monitored voltage $V_V$ is a virtual version of voltage $V_1$ at the DUT 4. With $V_0$ maintained at zero volts, the monitored voltage $V_V$ will equal the voltage across the DUT 4.

It is to be appreciated that the electrical current $I_1$ that flows through the DUT 4 also flows the resistor $R_I$ 12. Therefore, the current $I_1$ through the DUT 4 can be determined by measuring the voltage across the resistor $R_I$ 12. The measurement device 2 monitors the voltage $V_I$ across the resistor $R_I$ 12 via an amplifier 18. The current $I_1$ through the DUT 4 equals $V_I/R_I$.

The measurement device 2 can determine the impedance of the DUT 4 ($Z_{DUT}$) from the voltage $V_V$ across the DUT 4 and the current $I_1$ through the DUT 4 (e.g., $V_I/R_I$). The impedance (e.g., capacitance) of the DUT 4 can be determined by the following equation: $Z_{DUT}=(V_V/V_I) \cdot R_I$.

Figure 2:
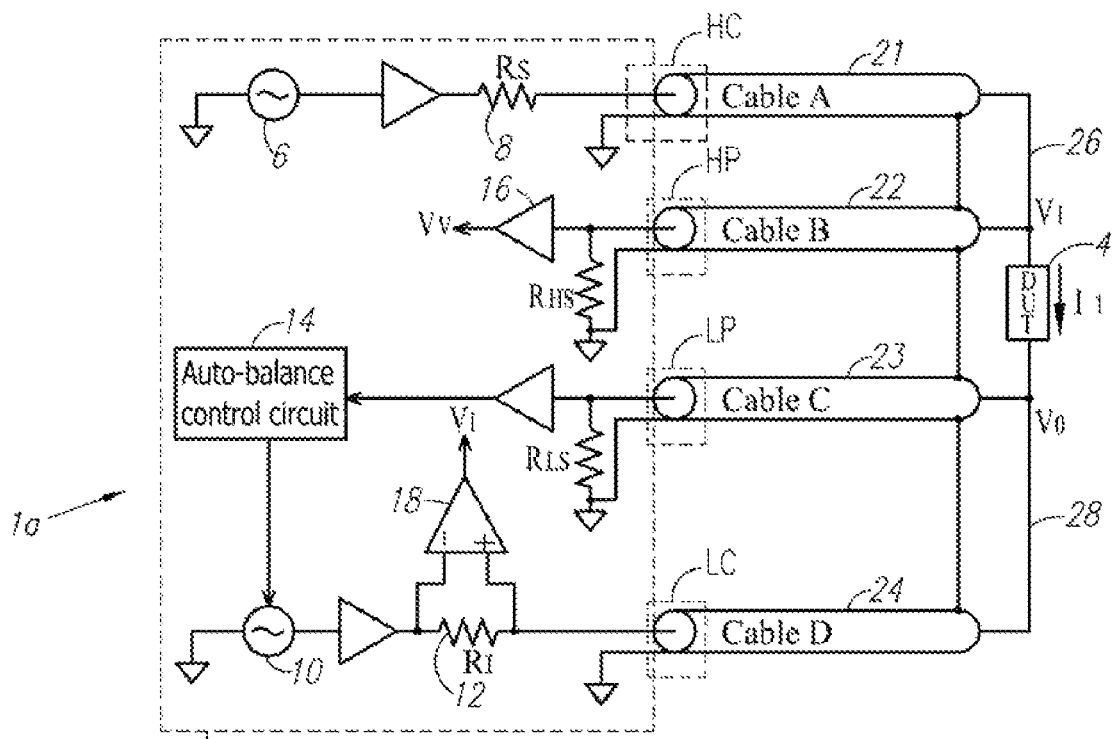
FIG. 2 is a schematic diagram of a circuit for measuring an impedance using an auto-balanced bridge technique and cables connected thereto.

The DUT 4 is typically located remote from the measurement device 2. As shown in FIG. 2, cables A-D 21, 22, 23, 24 connect the remote DUT 4 to the measurement device 2. In an embodiment, cables A-D 21-24 are coaxial cables. The cables 21-24 can distort the DUT 4 impedance measurement, and the amount of distortion is dependent upon the length of the cables 21-24. The cables 21-24 add phase delays "φ" to the circuit 1a ($\phi=2\pi d/\lambda$), where "d" is the electrical length of a cable and λ is the wavelength of an applied signal in vacuum. The distortion due to the phase delays added by the cables 21-24 can be corrected by the measurement device 2 if the phase delays of the cables are known.

It is possible that the phase delays of the cables are initially known. For example, some cables are manufactured to a target phase delay. If such cables are used to connect the DUT 4 to the measurement device 2, then the measurement device 2 can be programmed to compensate for the known target phase delays when determining the impedance $Z_{DUT}$ of the DUT 4.

It is also possible that the phase delays of the cables 21-24 are initially unknown. According to the present invention, the measurement device 2 can be configured to measure the phase delays of the cables 21-24 prior to determining the impedance $Z_{DUT}$ of the DUT 4. The circuit 1a with the DUT 4 removed is used to measure the phase delays of the cables 21-24. With the DUT 4 removed, the circuit 1a includes an open circuit portion between nodes 26 and 28.

The measurement device includes terminals HC, HP, LP, and LC. Terminal HC is a "source" terminal, through which the test signal 6 is transmitted, and terminal HP is a corresponding "sense" terminal. Similarly, terminal LC is a source terminal for another signal 10, and terminal LP is a corresponding sense terminal. One end of each cable 21-24 is connected to the measurement device 2 via terminals HC, HP, LP, and LC, respectively. Remote ends of cables A 21 and B 22 are connected at node 26 and remote ends of cables C 23 and D 24 are connected at node 28.

The measurement device 2 transmits a signal, such as the test signal 6, through terminal HC and along cable A 21. The transmitted signal returns to the measurement device 2 along cable B 22 and through terminal HP, and the measurement device 2 determines a combined phase delay for cables A and B. The measurement device 2 also transmits a signal though terminal LC and along cable D 24, which returns along cable C 23 and through terminal LP. The measurement device 2 determines a combined phase delay for cables C 23 and D 24. Assuming that the individual phase delay of cable A 21 and the individual phase delay of cable B 22 are identical, the measurement device can calculate the individual phase delays of cables A and B by dividing the measured combined phase delay for cables A and B in half. Similarly, the individual phase delays of cables C 23 and D 24 can be calculated by dividing the measured combined phase delay for cables C and D in half. The cabling phase delays, whether combined or individual, are retained by the measurement device 2 within a memory (not shown). Further, measurement device 2 can determine and retain the electrical length of each cable A-D 21-24.

After the cabling phase delays are determined, the DUT 4 is connected to the circuit 1a at nodes 26 and 28. The impedance of the DUT 4 is determined using the auto-balanced bridge technique while correcting for the cabling phase delays or electrical lengths.

Figure 3:
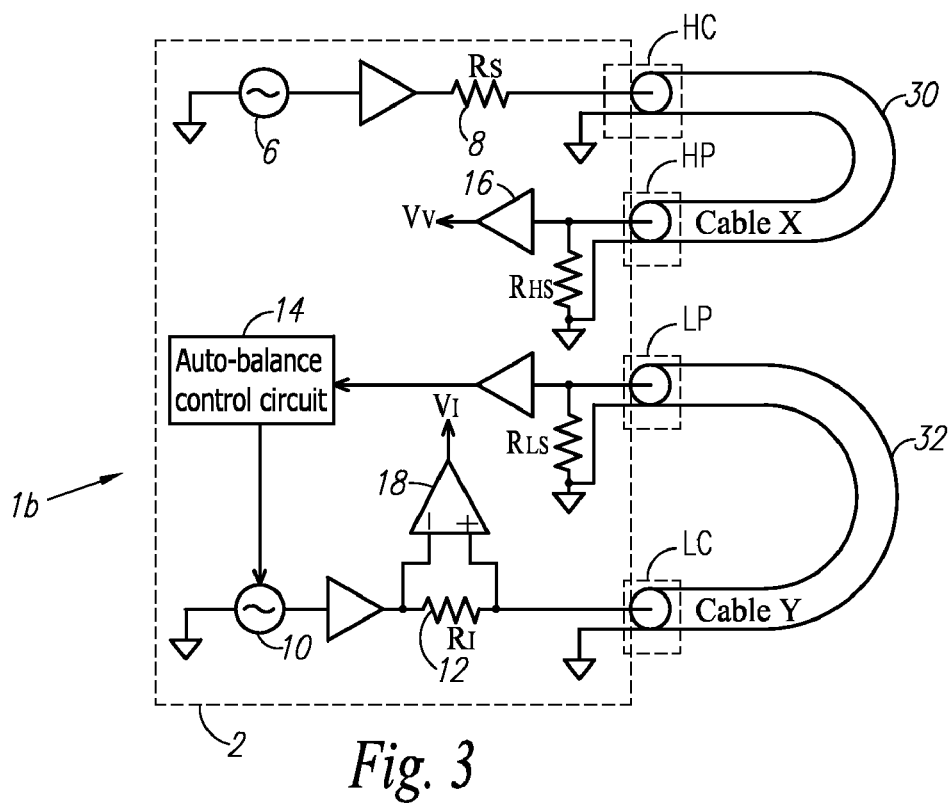
FIG. 3 is a schematic diagram of a circuit for measuring cable characteristics using an auto-balanced bridge technique and cables connected thereto.
Figure 4:
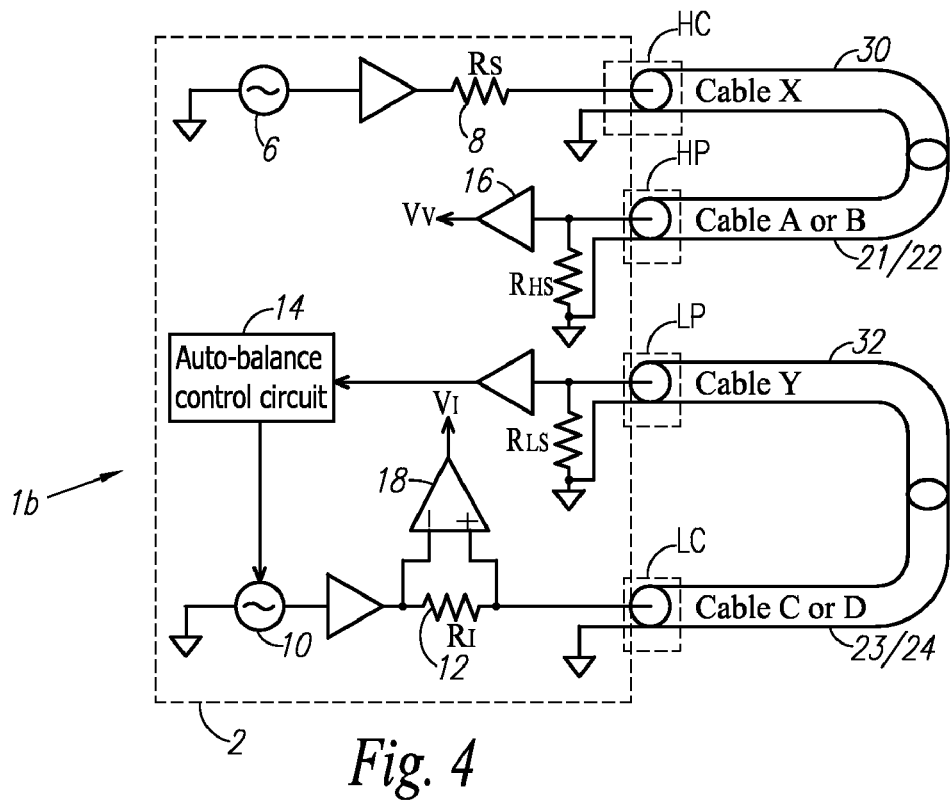
FIG. 4 is a schematic diagram of a circuit for measuring cable characteristics using an auto-balanced bridge technique and cables connected thereto.

Referring now to FIG. 3 and FIG. 4, another example embodiment of a system for determining cabling phase delays is shown. Again, the DUT 4 is removed from the circuit 1b when determining the cabling phase delays or electrical lengths.

As shown in FIG. 3, cable X 30 is connected between terminals HC and HP and cable Y 32 is connected between terminals LP and LC. The measurement device 2 transmits a signal, such as the test signal 6, through terminal HC and along cable X 30. The transmitted signal returns to the measurement device 2 through terminal HP, and the measurement device 2 determines an individual phase delay for cable X 30. The measurement device 2 also transmits a signal though terminal LC and along cable Y 32, which returns through terminal LP. The measurement device 2 determines an individual phase delay for cable Y 32.

As shown in FIG. 4, one end of cable X 30 is disconnected from either terminal HC or HP, and cable A 21 or cable B 22 is installed between the end of cable X and the disconnected terminal. Similarly, one end of cable Y 32 is disconnected from either terminal LP or LC, and cable C 23 or cable D 24 is installed between the end of cable Y and the disconnected terminal. The measurement device 2 transmits a signal, such as the test signal 6, through terminal HC and along cable X 30 and cable A 21 or B 22. The transmitted signal returns to the measurement device 2 through terminal HP, and the measurement device 2 determines a combined phase delay for cable X 30 and cable A 21 or B 22, whichever is connected. The measurement device 2 further determines the difference between the combined phase delay for cable X 30 and cable A 21 or B 22 and the individual phase delay for cable X, to determine the individual phase delay of cable A or B. The measurement device 2 also transmits a signal though terminal LC and along cable Y 32 and cable C 23 or D 24, and the signal returns through terminal LP. The measurement device 2 determines a combined phase delay for cable Y 32 and cable C 23 or D 24, whichever is connected. The measurement device 2 further determines the difference between the combined phase delay for cable Y 32 and cable C 23 or D 24 and the individual phase delay for cable Y, to determine the individual phase delay of cable C or D.

After the individual phase delay of each cable A-D 21-24 is determined, cables X 30 and Y 32 can be disconnected from the measurement device 2. The DUT 4 is connected to the measurement device 2 through cables A-D 21-24 and between nodes 26 and 28, as shown in FIG. 2. The impedance of the DUT 4 is determined using the auto-balanced bridge technique while correcting for the cabling phase delays or electrical lengths.

It is to be appreciated that in determining the individual phase delay of each cable A-D 21-24, the combined phase delay for cable X 30 and cable A 21 or B 22 can be determined prior to determining the individual phase delay for cable X 30. Similarly, the combined phase delay for cable Y 32 and cable C 23 or D 24 can be determined prior to determining the individual phase delay for cable Y 32. In this case, the set-up and measurements discussed above with respect to FIG. 4 occur prior to the set-up and measurements discussed above with respect to FIG. 3. Further, cables X 30 and Y 32 can be chosen from among cables A-D 21-24. For example, cable A 21 can be used as cable X 30 to determine the individual phase delay of cable B 22 and cable B can be used as cable X to determine the individual phase delay of cable A.

Cabling phase delays or electrical lengths, whether combined or individual, can be retained by the measurement device 2 within a memory (not shown), such as RAM or ROM.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A transmission line impedance compensation method, comprising the steps of:
   providing a measurement device that is adapted to source a test signal having a frequency to a device under test and to determine a corresponding impedance of the device under test using an auto-balanced bridge technique;
   connecting a first transmission line, a second transmission line, a third transmission line, and a fourth transmission line to said measurement device;
   connecting an end of the first transmission line to an end of the second transmission line;
   connecting an end of the third transmission line to an end of the fourth transmission line;
   measuring, by said measurement device, a combined phase delay of the connected first and second transmission lines;
   measuring, by said measurement device, a combined phase delay of the connected third and fourth transmission lines;
   connecting the device under test to the first transmission line, the second transmission line, the third transmission line, and the fourth transmission line after measuring the phase delay of the connected first and second transmission lines and the phase delay of the connected third and fourth transmission lines; and
   determining said corresponding impedance of the device under test based on both of the combined phase delay of the connected first and second transmission lines and the combined phase delay of the connected third and fourth transmission lines.

2. A method as set forth in claim 1, further comprising the steps of:
   determining a phase delay of the first transmission line based on the combined phase delay of the connected first and second transmission lines;
   determining a phase delay of the second transmission line based on the combined phase delay of the connected first and second transmission lines;
   determining a phase delay of the third transmission line based on the combined phase delay of the connected third and fourth transmission lines; and
   determining a phase delay of the fourth transmission line based on the combined phase delay of the connected third and fourth transmission lines.

3. A method as set forth in claim 1, further comprising the steps of:
   determining an electrical length of the first transmission line based on the combined phase delay of the connected first and second transmission lines;
   determining an electrical length of the second transmission line based on the combined phase delay of the connected first and second transmission lines;
   determining an electrical length of the third transmission line based on the combined phase delay of the connected third and fourth transmission lines; and
   determining an electrical length of the fourth transmission line based on the combined phase delay of the connected third and fourth transmission lines.

4. A method as set forth in claim 1, wherein the measurement device measures capacitance versus voltage, and further wherein said corresponding impedance is a capacitance.

5. A method as set forth in claim 4, wherein said transmission lines are coaxial cables.

6. A device comprising:
   an impedance meter for determining the impedance of a device under test, the impedance meter having:
      a first source terminal for connecting the impedance meter to the device under test;
      a first sense terminal for connecting the impedance meter to the device under test;
      a second source terminal for connecting the impedance meter to the device under test; and
      a second sense terminal for connecting the impedance meter to the device under test;
      wherein the impedance meter is adapted to determine an electrical length of a first transmission line connected to at least one of said terminals,
   wherein one end of the first transmission line is connected to the first source terminal, one end of a second transmission line is connected to the first sense terminal, and other ends of the first and second transmission lines are connected together,
   wherein one end of a third transmission line is connected to the second source terminal, one end of a fourth transmission line is connected to the second sense terminal, and other ends of the third and fourth transmission lines are connected together,
   wherein the impedance meter transmits a first signal through the first and second transmission lines and measures a combined phase delay of the first and second transmission lines based on the first signal,
   wherein the impedance meter transmits a second signal through the third and fourth transmission lines and measures a combined phase delay of the third and fourth transmission lines based on the second signal, and
   wherein the impedance of the device under test is determined based on said combined phase delays.

7. A device comprising:
an impedance meter for determining the impedance of a device under test, the impedance meter having:
   a first source terminal for connecting the impedance meter to the device under test;
   a first sense terminal for connecting the impedance meter to the device under test;
   a second source terminal for connecting the impedance meter to the device under test; and
   a second sense terminal for connecting the impedance meter to the device under test;
   wherein the impedance meter is adapted to determine an electrical length of a first transmission line connected to at least one of said terminals,
wherein one end of the first transmission line is connected to one of the first source terminal and the first sense terminal, one end of another transmission line is connected to the other one of the first source terminal and the first sense terminal, and other ends of the first transmission line and said another transmission line are connected together,
wherein the impedance meter transmits a first signal through the first transmission line and said another transmission line and measures a combined phase delay of the first and said another transmission line based on the first signal,
wherein the impedance meter determines the electrical length of the first transmission line based on said combined phase delay of the first and said another transmission line,
wherein one end of a third transmission line is connected to one of the second source terminal and the second sense terminal, one end of a fourth transmission line is connected to the other one of the second source terminal and the second sense terminal, and other ends of the third and fourth transmission lines are connected together,
wherein the impedance meter transmits a second signal through the third and fourth transmission lines and measures a combined phase delay of the third and fourth transmission lines based on the second signal,
wherein the impedance meter determines the electrical length of the third transmission line based on the combined phase delay of the third and fourth transmission lines, and
wherein the impedance of the device under test is determined based the electrical length of the first transmission line and the electrical length of the third transmission line.

8. A transmission line impedance compensation method, comprising the steps of:
   providing a measurement device that is adapted to source a test signal having a frequency to a device under test and to determine a corresponding impedance of the device under test using an auto-balanced bridge technique, wherein the measurement device includes a first terminal, a second terminal, a third terminal, and a fourth terminal;
   connecting an end of a first transmission line to the first terminal;
   connecting another end of the first transmission line to the second terminal;
   connecting an end of a second transmission line to the third terminal;
   connecting another end of the second transmission line to the fourth terminal;
   measuring, by said measurement device, a phase delay of the first transmission line;
   measuring, by said measurement device, a phase delay of the second transmission line;
   connecting an end of a third transmission line to said end or said another end of the first transmission line and connecting another end of the third transmission line to one of the first terminal and the second terminal;
   connecting an end of a fourth transmission line to said end or said another end of the second transmission line and connecting another end of the fourth transmission line to one of the third terminal and the fourth terminal;
   measuring, by said measurement device, a combined phase delay of the connected first and third transmission lines;
   measuring, by said measurement device, a combined phase delay of the connected second and fourth transmission lines;
   calculating a difference between the combined phase delay of the connected first and third transmission lines and the phase delay of the first transmission line to determine a phase delay of the third transmission line;
   calculating a difference between the combined phase delay of the connected second and fourth transmission lines and the phase delay of the second transmission line to determine a phase delay of the fourth transmission line; and
   determining said corresponding impedance of the device under test based on said phase delay of the third transmission line and said phase delay of the fourth transmission line.

9. A method as set forth in claim 8, wherein the measurement device measures capacitance versus voltage, and further wherein said corresponding impedance is a capacitance.

10. A method as set forth in claim 9, wherein said transmission lines are coaxial cables.

11. A method as set forth in claim 10, wherein two of said terminals are source terminals and two of said terminals are sense terminals.

* * * * *